(12) United States Patent
Qiao et al.

(10) Patent No.: US 8,265,568 B2
(45) Date of Patent: Sep. 11, 2012

(54) FREQUENCY DIVIDER WITH SYNCHRONIZED OUTPUTS

(75) Inventors: Dongjiang Qiao, San Diego, CA (US); Frederic Bossu, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 671 days.

(21) Appl. No.: 12/407,700

(22) Filed: Mar. 19, 2009

(65) Prior Publication Data
US 2010/0240323 A1 Sep. 23, 2010

(51) Int. Cl.
*H03K 25/00* (2006.01)
(52) U.S. Cl. ............................ 455/76; 327/115; 327/117
(58) Field of Classification Search .................. None
See application file for complete search history.

(56) References Cited

U.S. PATENT DOCUMENTS

| | | | | |
|---|---|---|---|---|
| 4,816,700 | A * | 3/1989 | Imel | 327/154 |
| 5,220,216 | A * | 6/1993 | Woo | 326/50 |
| 5,341,031 | A * | 8/1994 | Kinoshita et al. | 327/259 |
| 5,587,672 | A * | 12/1996 | Ranganathan et al. | 326/93 |
| 6,292,041 | B1 * | 9/2001 | Naffziger | 327/172 |
| 6,617,904 | B1 * | 9/2003 | Schwarz et al. | 327/295 |
| 7,012,956 | B1 | 3/2006 | Thomsen et al. | |
| 7,532,049 | B2 * | 5/2009 | Jewett | 327/117 |
| 7,622,965 | B2 * | 11/2009 | Scoville | 327/144 |
| 2007/0109019 | A1 | 5/2007 | Wu et al. | |
| 2007/0290737 | A1 * | 12/2007 | Li | 327/404 |
| 2008/0164927 | A1 * | 7/2008 | Wang | 327/254 |
| 2008/0169857 | A1 * | 7/2008 | Hwang et al. | 327/278 |
| 2008/0186063 | A1 | 8/2008 | Jewett | |
| 2008/0297258 | A1 * | 12/2008 | Naito et al. | 330/282 |
| 2008/0313485 | A1 * | 12/2008 | Frank et al. | 713/401 |
| 2009/0245420 | A1 * | 10/2009 | Hausmann et al. | 375/298 |
| 2009/0284288 | A1 * | 11/2009 | Zhang et al. | 327/118 |

FOREIGN PATENT DOCUMENTS

EP 0926833 A1 6/1999

OTHER PUBLICATIONS

International Search Report and Written Opinion—PCT/US10/027865, International Search Authority—European Patent Office, May 12, 2010.

* cited by examiner

*Primary Examiner* — Tuan T Lam
(74) *Attorney, Agent, or Firm* — S. Hossain Beladi

(57) ABSTRACT

A synchronized frequency divider that can divide a clock signal in frequency and provide differential output signals having good signal characteristics is described. In one exemplary design, the synchronized frequency divider includes a single-ended frequency divider and a synchronization circuit. The single-ended frequency divider divides the clock signal in frequency and provides first and second single-ended signals, which may be complementary signals having timing skew. The synchronization circuit resamples the first and second single-ended signals based on the clock signal and provides differential output signals having reduced timing skew. In one exemplary design, the synchronization circuit includes first and second switches and first and second inverters. The first switch and the first inverter form a first sample-and-hold circuit or a first latch that resamples the first single-ended signal. The second switch and the second inverter form a second sample-and-hold circuit or a second latch that resamples the second single-ended signal.

27 Claims, 9 Drawing Sheets

US 8,265,568 B2

FREQUENCY DIVIDER WITH SYNCHRONIZED OUTPUTS

BACKGROUND

I. Field

The present disclosure relates generally to electronics, and more specifically to a frequency divider.

II. Background

A frequency divider is a circuit that receives a clock signal at a first frequency, divides the clock signal in frequency, and provides a divider output signal having a second frequency that is a fraction of the first frequency. Frequency dividers are commonly used in various circuit blocks such as phase locked loops (PLLs), frequency synthesizers, downconverters, upconverters, etc. These applications often require differential output signals from the frequency dividers. A frequency divider that can generate differential output signals with good signal characteristics while consuming low power is highly desirable.

SUMMARY

A synchronized frequency divider that can provide differential output signals having good signal characteristics while consuming low power is described herein. In one exemplary design, the synchronized frequency divider includes a single-ended frequency divider and a synchronization circuit. The single-ended frequency divider divides a clock signal in frequency and provides first and second single-ended signals, which may be complementary signals having timing skew. The synchronization circuit resamples the first and second single-ended signals based on the clock signal and provides differential output signals having reduced timing skew.

In one exemplary design, the single-ended frequency divider includes three inverters coupled in a loop. Two of the inverters may be latched based on non-inverted and inverted versions of the clock signal. The first and second single-ended signals may be provided by two inverters. In one exemplary design, the synchronization circuit includes first and second switches coupled to first and second inverters, respectively. The first switch and the first inverter may form a first sample-and-hold circuit or a first latch that resamples the first single-ended signal. The second switch and the second inverter may form a second sample-and-hold circuit or a second latch that resamples the second single-ended signal. Other exemplary designs of the synchronization circuit are described below.

Various aspects and features of the disclosure are described in further detail below.

DETAILED DESCRIPTION

The word "exemplary" is used herein to mean "serving as an example, instance, or illustration." Any design described herein as "exemplary" is not necessarily to be construed as preferred or advantageous over other designs.

The synchronized frequency divider described herein may be used for various electronics devices. For example, the synchronized frequency divider may be used for wireless communication devices, cellular phones, personal digital assistants (PDAs), handheld devices, wireless modems, laptop computers, cordless phones, Bluetooth devices, a broadcast receiver, etc. For clarity, the use of the synchronized frequency divider for a wireless communication device is described below.

Figure 1:
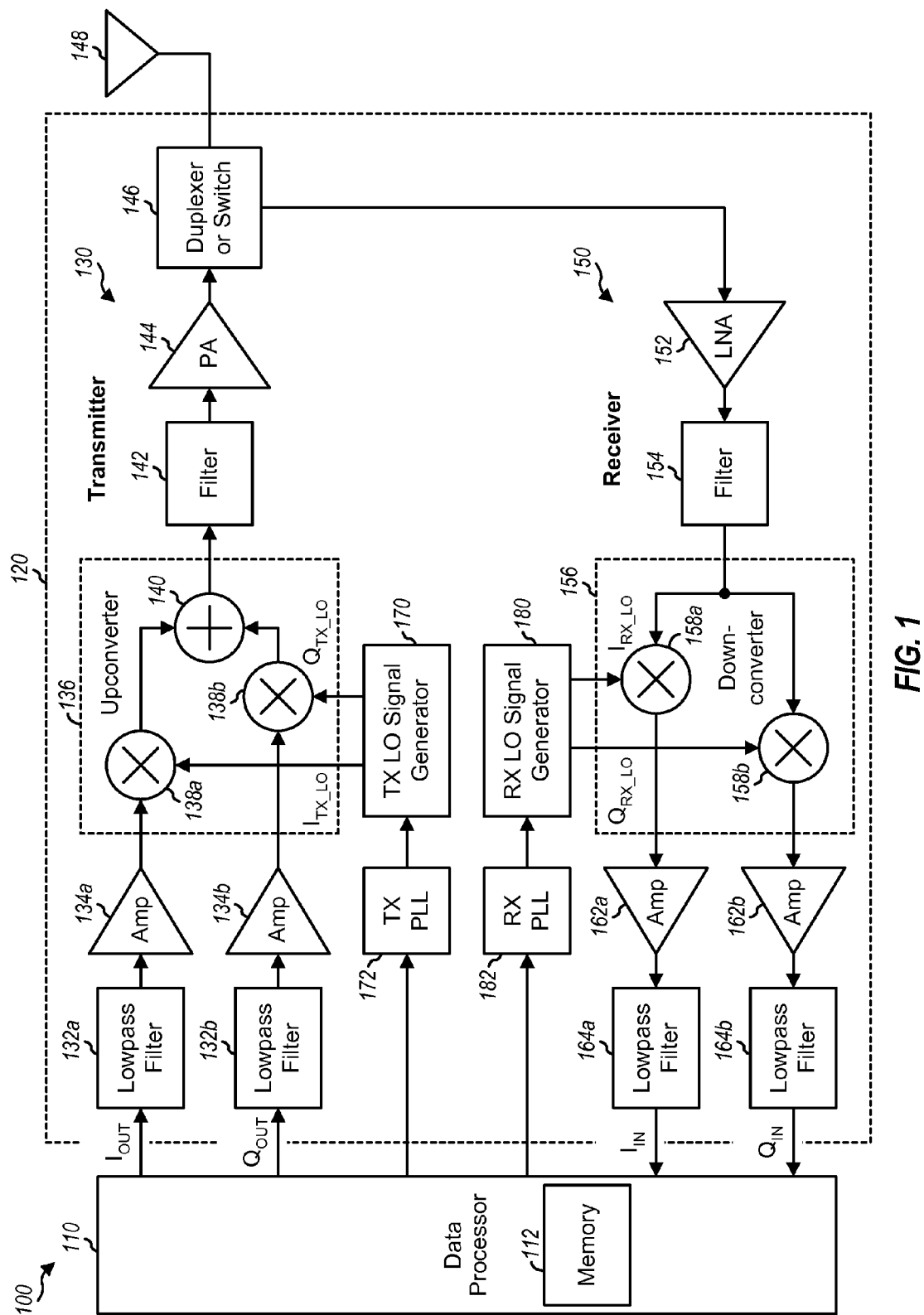
FIG. 1 shows a block diagram of a wireless communication device.

FIG. 1 shows a block diagram of an exemplary design of a wireless communication device 100 in which the synchronized frequency divider may be implemented. In the exemplary design shown in FIG. 1, wireless device 100 includes a transceiver 120 and a data processor 110 having a memory 112 to store data and program codes. Transceiver 120 includes a transmitter 130 and a receiver 150 that support bi-directional communication. In general, wireless device 100 may include any number of transmitters and any number of receivers for any number of communication systems and frequency bands.

A transmitter or a receiver may be implemented with a super-heterodyne architecture or a direct-conversion architecture. In the super-heterodyne architecture, a signal is frequency converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the exemplary design shown in FIG. 1, transmitter 130 and receiver 150 are implemented with the direct-conversion architecture.

In the transmit path, data processor 110 processes data to be transmitted and provides an I analog output signal ($I_{OUT}$) and a Q analog output signal ($Q_{OUT}$) to transmitter 130. Within transmitter 130, lowpass filters 132a and 132b filter the I and Q analog output signals, respectively, to remove undesired images caused by the prior digital-to-analog conversion. Amplifiers (Amp) 134a and 134b amplify the signals from lowpass filters 132a and 132b, respectively, and provide I and Q baseband signals. An upconverter 136 receives the I and Q baseband signals and an I transmit (TX) local oscillator (LO) signal ($I_{TX\_LO}$) and a Q TX LO signal ($Q_{TX\_LO}$) from a TX LO signal generator 170. Within upconverter 136, a mixer 138a upconverts the I baseband signal with the I TX LO signal, a mixer 138b upconverts the Q baseband signal with the Q TX LO signal, and a summer 140 sums the outputs of mixers 138a and 138b and provides an upconverted signal. A filter 142 filters the upconverted signal to remove undesired images caused by the frequency upconversion as well as noise in a receive frequency band. A power amplifier (PA) 144 amplifies the signal from filter 142 to obtain the desired output power level and provides a transmit RF signal. The transmit RF signal is routed through a duplexer or switch 146 and transmitted via an antenna 148.

In the receive path, antenna 148 receives signals transmitted by base stations and provides a received RF signal, which is routed through duplexer or switch 146 and provided to a low noise amplifier (LNA) 152. The received RF signal is amplified by LNA 152 and filtered by a filter 154 to obtain a desired RF input signal. A downconverter 156 receives the RF input signal and an I receive (RX) LO signal ($I_{RX\_LO}$) and a Q RX LO signal ($Q_{RX\_LO}$) from an RX LO signal generator 180. Within downconverter 156, a mixer 158a downconverts the RF input signal with the I RX LO signal and provides an I baseband signal. A mixer 158b downconverts the RF input signal with the Q RX LO signal and provides a Q baseband signal. The I and Q baseband signals are amplified by amplifiers 162a and 162b and further filtered by lowpass filters 164a and 164b to obtain an I analog input signal ($I_{IN}$) and a Q analog input signal ($Q_{IN}$), which are provided to data processor 110.

TX LO signal generator 170 generates the I and Q TX LO signals used for frequency upconversion. RX LO signal generator 180 generates the I and Q RX LO signals used for frequency downconversion. Each LO signal is a periodic signal with a particular fundamental frequency. A PLL 172 receives timing information from data processor 110 and generates a control signal used to adjust the frequency and/or phase of the TX LO signals from LO signal generator 170. Similarly, a PLL 182 receives timing information from data processor 110 and generates a control signal used to adjust the frequency and/or phase of the RX LO signals from LO signal generator 180.

FIG. 1 shows an exemplary transceiver design. In general, the conditioning of the signals in a transmitter and a receiver may be performed by one or more stages of amplifier, filter, upconverter, downconverter, etc. These circuit blocks may be arranged differently from the configuration shown in FIG. 1. Furthermore, other circuit blocks not shown in FIG. 1 may also be used to condition the signals in the transmitter and receiver. Some circuit blocks in FIG. 1 may also be omitted. All or a portion of transceiver 120 may be implemented on one or more analog integrated circuits (ICs), RF ICs (RFICs), mixed-signal ICs, etc.

LO signal generators 170 and 180 may each include a frequency divider that receives a clock signal and provides a divider output signal. The clock signal may be generated by a voltage-controlled oscillator (VCO) or some other types of oscillator. The clock signal may also be referred to as a VCO signal, an oscillator signal, etc. In any case, it may be desirable to obtain differential output signals from a frequency divider.

Figure 2:
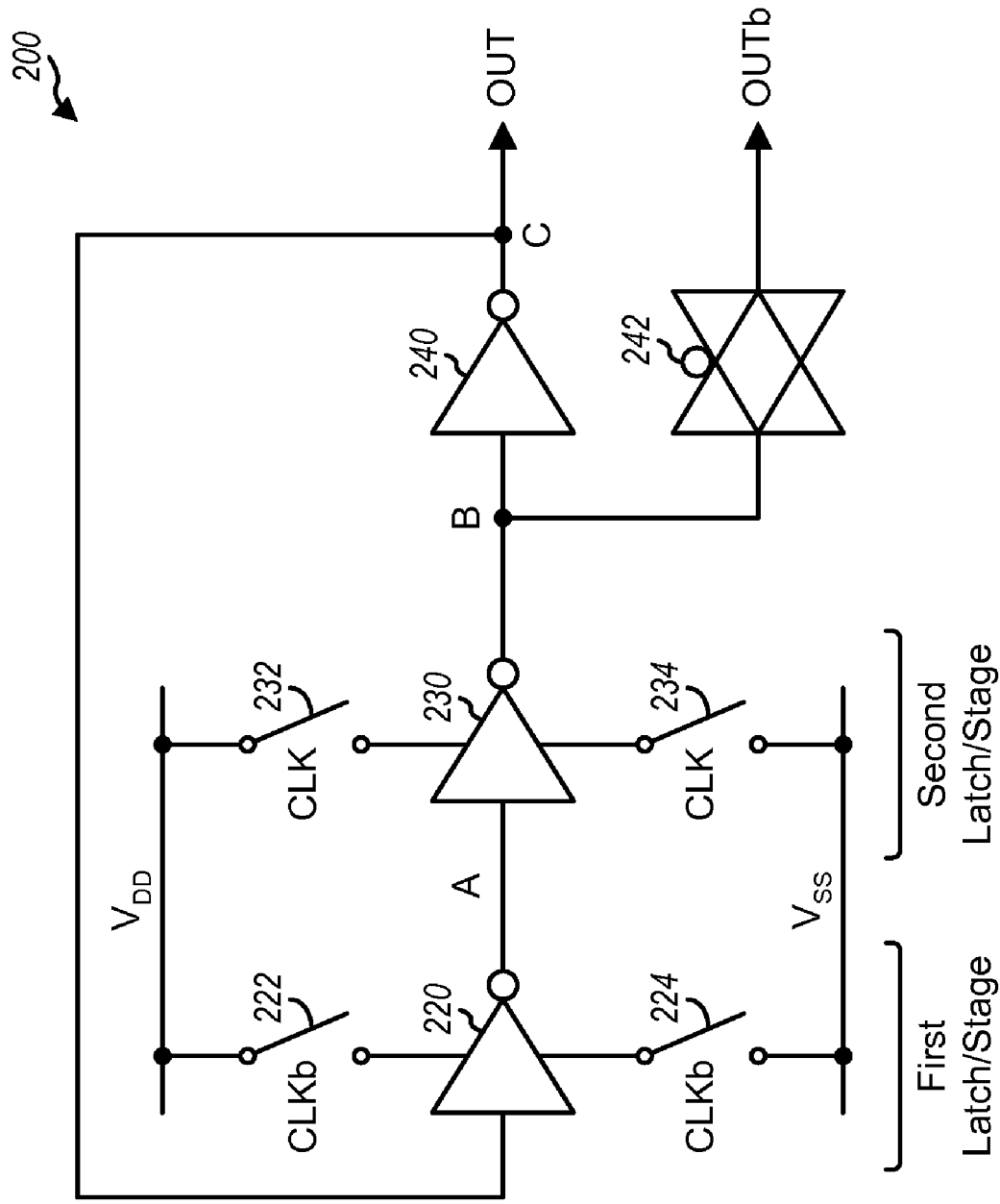
FIG. 2 shows a frequency divider with differential output signals.

FIG. 2 shows a schematic diagram of a conventional design of a frequency divider 200 with differential output signals. Frequency divider 200 includes three inverters 220, 230 and 240 coupled in a loop. Inverter 220 has its input coupled to the output of inverter 240 and its output coupled to the input of inverter 230. Inverter 230 has its output coupled to the input of inverter 240. The outputs of inverters 220, 230 and 240 are labeled as nodes A, B and C, respectively. Switches 222 and 232 have one end coupled to an upper power supply $V_{DD}$ and the other end coupled to an upper supply input of inverters 220 and 230, respectively. Switches 224 and 234 have one end coupled to a lower power supply $V_{SS}$ (e.g., circuit ground) and the other end coupled to a lower supply input of inverters 220 and 230, respectively. Switches 222 and 224 are controlled by an inverting clock signal, CLKb. Switches 232 and 234 are controlled by a non-inverting clock signal, CLK. Inverter 240 provides a non-inverting output signal, OUT. A transmission gate 242 has one end coupled to node B and the other end providing an inverting output signal, OUTb.

Inverter 220 and switches 222 and 224 form a first stage and act as a first latch that latches the signal from inverter 240 on the rising edges of the CLKb signal. Inverter 230 and switches 232 and 234 form a second stage and act as a second latch that latches the signal from inverter 220 on the rising edges of the CLK signal. Because three inverters 220, 230 and 240 are coupled in a loop, the signal at the output of the first latch (or node A) toggles when latched by the CLKb signal, and the signal at the output of the second latch (or node B) also toggles when latched by the CLK signal.

Inverters 220, 230 and 240 and switches 222, 224, 232 and 234 form a single-ended frequency divider that provides the OUT signal. A single-ended frequency divider is a frequency divider that operates on single-ended signals. Transmission gate 242 provides the OUTb signal, which is complementary to the OUT signal. The OUT and OUTb signals are differential output signals of frequency divider 200. Transmission gate 242 is typically designed to have a delay that matches the delay of inverter 240. However, the delay of transmission gate 242 may differ from the delay of inverter 240 due to variations in IC process, output loading, supply voltage, and temperature and may further be frequency dependent. The difference in delays may result in timing skew between the OUT and OUTb signals. The timing skew may adversely impact the performance of a circuit block utilizing the OUT and OUTb signals from frequency divider 200. Timing skew may also be referred to as timing error, phase error, phase skew, etc.

A differential frequency divider may be used to generate differential output signals. However, the differential frequency divider may consume more power and may thus be undesirable for low-power applications such as wireless devices. Furthermore, the differential frequency divider may have other disadvantages such as a larger die area needed for implementation on an IC, a lower maximum operating frequency, etc.

In an aspect, a synchronized frequency divider composed of a single-ended frequency divider and a synchronization circuit may be used to generate differential output signals. The use of the single-ended frequency divider may reduce power consumption, reduced die area for implementation, and improved operating speed. The synchronization circuit can receive single-ended signals and provide differential output signals having good signal characteristics. The synchronized frequency divider may be used for TX LO signal generator 170, RX LO signal generator 180, and/or other circuit blocks in FIG. 1.

Figure 3:
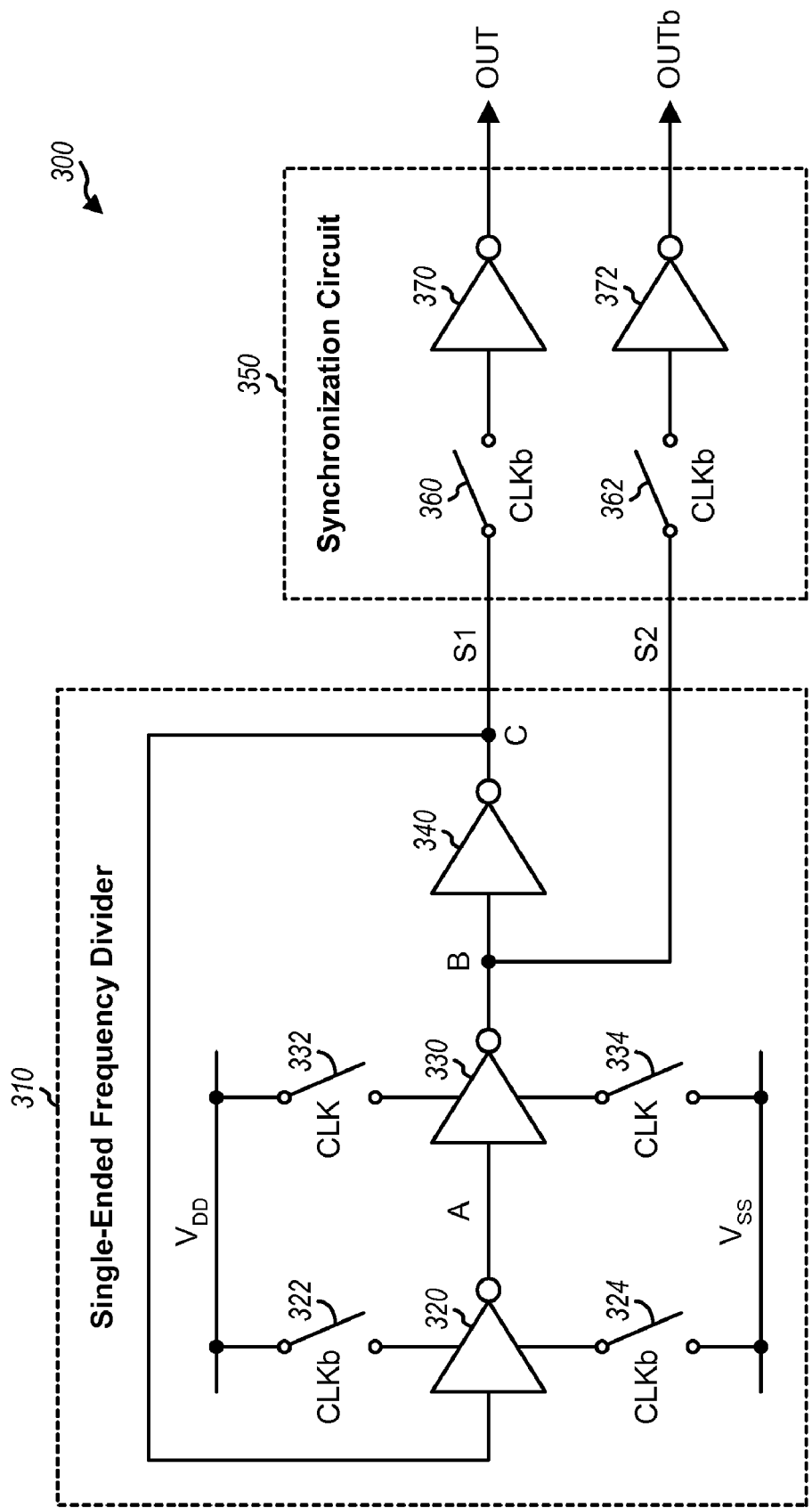
FIG. 3 shows a synchronized frequency divider.

FIG. 3 shows a schematic diagram of an exemplary design of a synchronized frequency divider 300, which includes a single-ended frequency divider 310 and a synchronization circuit 350. Single-ended frequency divider 310 includes inverters 320, 330 and 340 and switches 322, 324, 332 and 334, which are coupled in the same manner as inverters 220, 230 and 240 and switches 222, 224, 232 and 234, respectively, in FIG. 2. Inverter 340 provides a first single-ended signal, S1, and inverter 330 provides a second single-ended signal, S2.

Synchronization circuit 350 includes switches 360 and 362 and inverters 370 and 372. Switch 360 has one end coupled to the output of inverter 340 and the other end coupled to the input of inverter 370. Switch 362 has one end coupled to the output of inverter 330 and the other end coupled to the input of inverter 372. Inverter 370 provides the OUT signal, and inverter 372 provides the OUTb signal.

Switch 360 and inverter 370 form a first sample-and-hold circuit. Switch 362 and inverter 372 form a second sample-and-hold circuit. Switches 360 and 362 receive complementary single-ended signals from inverters 340 and 330, respectively. Switches 360 and 362 are enabled by the same CLKb signal and provide their complementary single-ended signals to inverters 370 and 372 at the same time. Inverters 370 and 372 provide the OUT and OUTb signals, which are complementary to one another and have the same timing determined by the CLKb signal.

Figure 4:
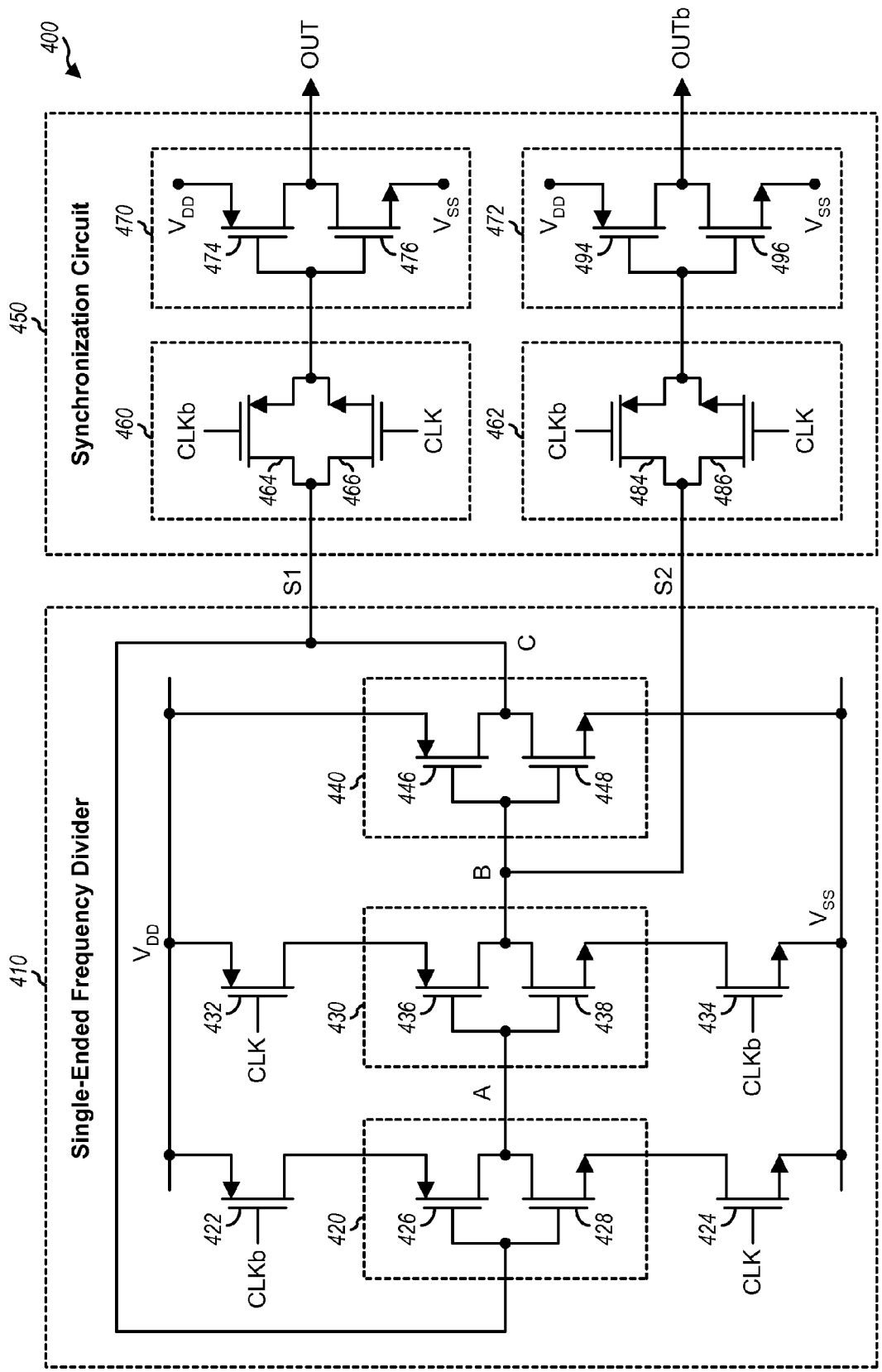
FIG. 4 shows an exemplary design of the synchronized frequency divider with MOS transistors.

FIG. 4 shows a schematic diagram of an exemplary design of a synchronized frequency divider 400, which implements synchronized frequency divider 300 in FIG. 3 using complementary metal oxide semiconductor (CMOS) transistor. The terms "transistor" and "device" are often used interchangeably, e.g., MOS transistors are often referred to as MOS devices.

Synchronized frequency divider 400 includes a single-ended frequency divider 410 and a synchronization circuit 450. Single-ended frequency divider 410 includes inverters 420, 430 and 440 that are coupled in a similar manner as inverters 320, 330 and 340, respectively, in FIG. 3. Inverter 420 includes a P-channel MOS (PMOS) transistor 426 and an N-channel MOS (NMOS) transistor 428. Inverter 430 includes a PMOS transistor 436 and an NMOS transistor 438. Inverter 440 includes a PMOS transistor 446 and an NMOS transistor 448. For each inverter, the PMOS transistor and the NMOS transistor have their gates coupled together and to the inverter input and their drains coupled together and to the inverter output. PMOS transistors 422 and 432 implement switches 322 and 332, respectively. PMOS transistors 422 and 432 have their sources coupled to the $V_{DD}$ supply, their drains coupled to the sources of PMOS transistors 426 and 436, respectively, and their gates receiving the CLKb and CLK signals, respectively. NMOS transistors 424 and 434 implement switches 324 and 334, respectively. NMOS transistors 424 and 434 have their sources coupled to the $V_{SS}$ supply, their drains coupled to the sources of NMOS transistors 428 and 438, respectively, and their gates receiving the CLK and CLKb signals, respectively.

Synchronization circuit 450 includes switches 460 and 462 and inverters 470 and 472, which are coupled in a similar manner as switches 360 and 362 and inverters 370 and 372, respectively, in FIG. 3. Switch 460 includes a PMOS transistor 464 and an NMOS transistor 466 coupled in parallel. Switch 462 includes a PMOS transistor 484 and an NMOS transistor 486 coupled in parallel. For each switch, the PMOS transistor and the NMOS transistor have their drains coupled together, their sources coupled together, and their gates receiving the CLKb and CLK signals, respectively. Inverter 470 includes a PMOS transistor 474 and an NMOS transistor 476. Inverter 472 includes a PMOS transistor 494 and an NMOS transistor 496.

FIG. 4 shows an exemplary design of a synchronized frequency divider implemented with MOS transistors. A synchronized frequency divider may also be implemented with other types of transistors and/or other circuit components.

Figure 5:
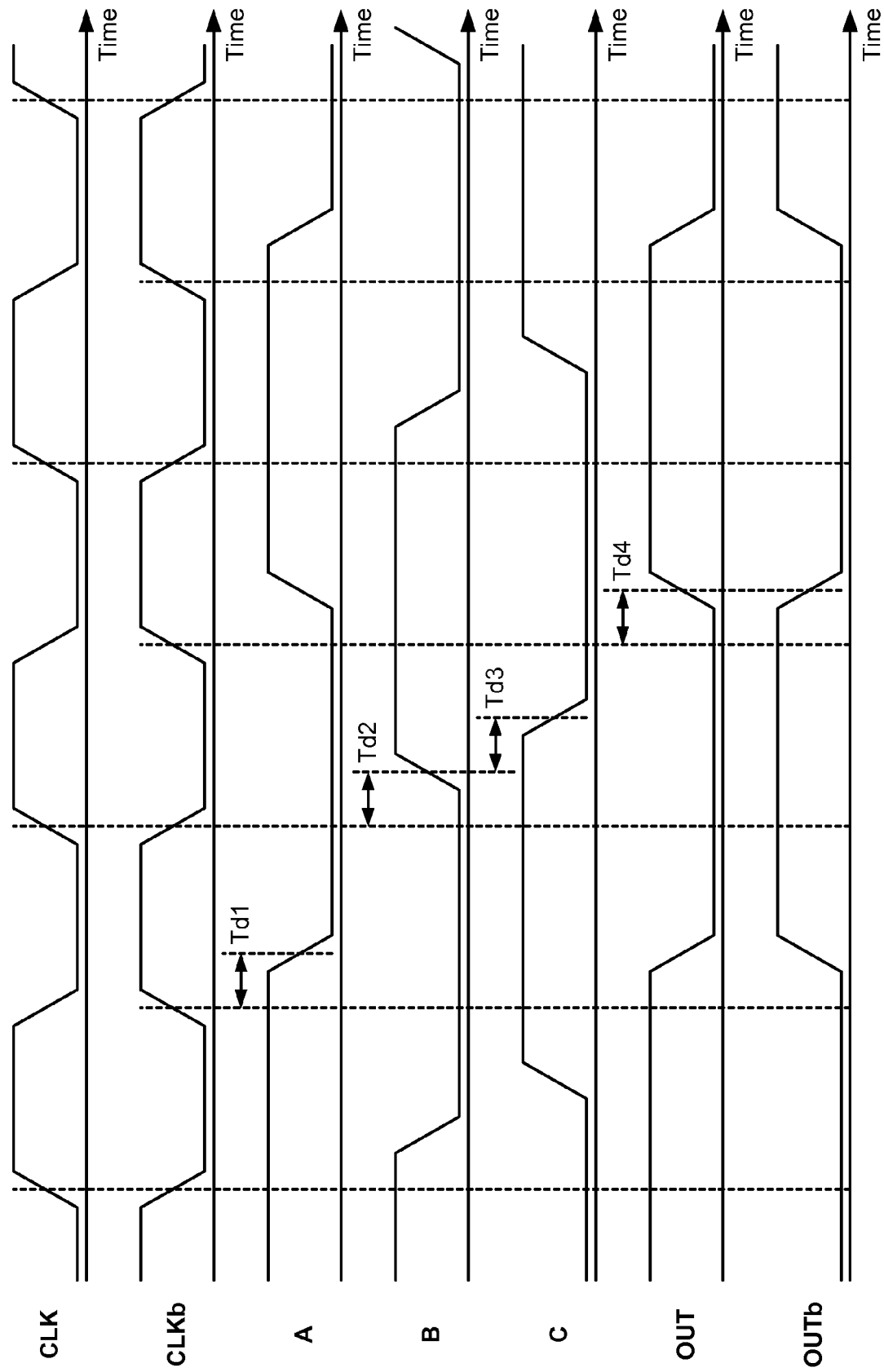
FIG. 5 shows a timing diagram for the synchronized frequency divider in FIG. 3.

FIG. 5 shows a timing diagram for synchronized frequency divider 300 in FIG. 3. The CLK and CLKb signals are shown at the top of FIG. 5 and are complementary to one another. The signal at node A is provided by inverter 320 and is delayed by Td1 from the leading edges of the CLKb signal. The signal at node B is provided by inverter 330 and is delayed by Td2 from the leading edges of the CLK signal. The signal at node C is provided by inverter 340 and is inverted and delayed by Td3 from the signal at node B. The OUT and OUTb signals are provided by inverters 370 and 372 and are delayed by Td4 from the leading edges of the CLKb signal.

As shown in FIG. 5, the signals at nodes B and C have opposite logic levels and a timing skew caused by the delay of inverter 340 located between nodes B and C in FIG. 3. The signals at nodes B and C are resampled at the leading edges of the CLKb signal to generate the OUTb and OUT signals. The resampling removes the delay caused by inverter 340, and the OUTb and OUT signals are time aligned.

The resampling of the signals at nodes B and C should occur when these signals are stable. Phase errors may increase if the resampling occurs when the signals at nodes B and C are not settled. The maximum speed of the resampling may be limited by the Td2 delay due to inverter 330 located between nodes A and B and the Td3 delay due to inverter 340 located between node B and C. The maximum speed $f_{max}$ may be given as $$f_{max} \leq \frac{1}{2 \cdot (Td2 + Td3)}.$$

Figure 6:
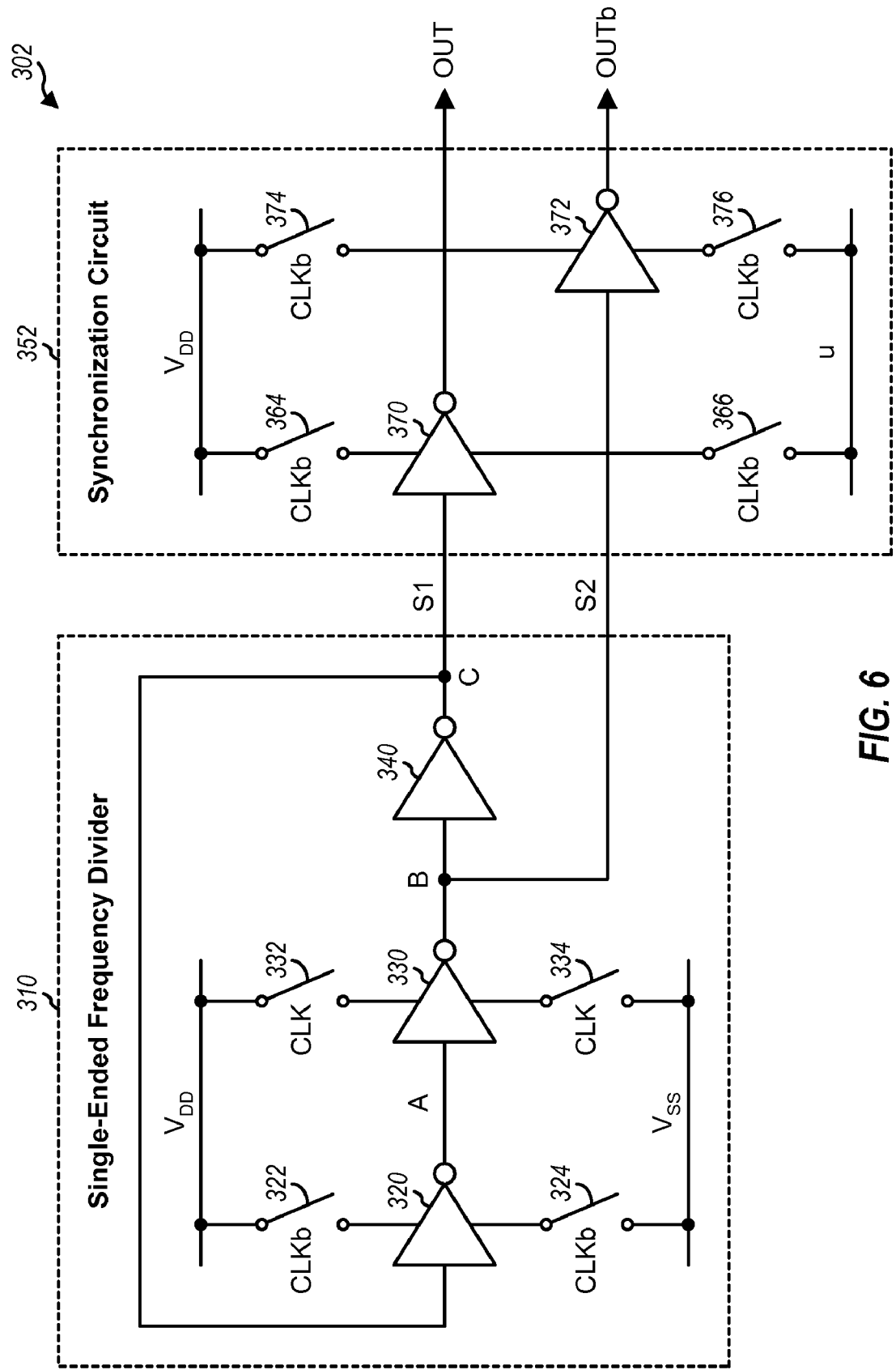
FIGS. 6 and 7 show two additional exemplary designs of the synchronized frequency divider.

FIG. 6 shows a schematic diagram of an exemplary design of a synchronized frequency divider 302, which includes single-ended frequency divider 310 and a synchronization circuit 352. Synchronization circuit 352 includes inverters 370 and 372 and switches 364, 366, 374 and 376. Inverters 370 and 372 have their inputs coupled to nodes C and B, respectively, and their outputs providing the OUT and OUTb signals, respectively. Switches 364 and 374 have one end coupled to the $V_{DD}$ supply and the other end coupled to an upper supply input of inverters 370 and 372, respectively. Switches 366 and 376 have one end coupled to the $V_{SS}$ supply and the other end coupled to a lower supply input of inverters 370 and 372, respectively. Switches 364, 366, 374 and 376 are controlled by the CLKb signal. Inverter 370 and switches 364 and 366 form a latch that latches the signal at node C on the rising edges of the CLKb signal and provides the OUT signal. Inverter 372 and switches 374 and 376 form another latch that latches the signal at node B on the rising edges of the CLKb signal and provides the OUTb signal.

Figure 7:
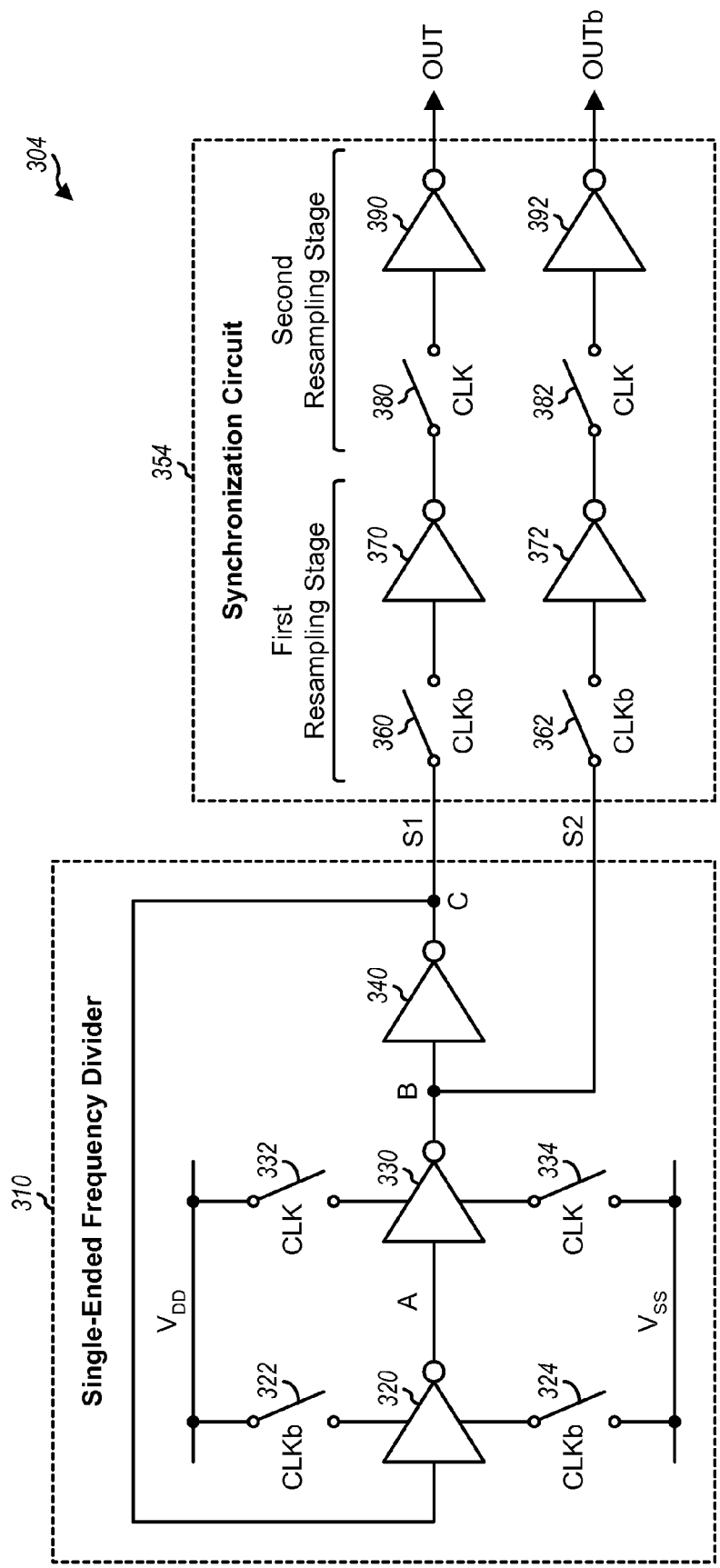

FIG. 7 shows a schematic diagram of an exemplary design of a synchronized frequency divider 304, which includes single-ended frequency divider 310 and a synchronization circuit 354. Synchronization circuit 354 includes switches 360 and 362 and inverters 370 and 372, which are coupled in a similar manner as described above for FIG. 3. Synchronization circuit 354 further includes switches 380 and 382 and inverters 390 and 392. Switch 380 has one end coupled to the output of inverter 370 and the other end coupled to the input of inverter 390. Switch 382 has one end coupled to the output of inverter 372 and the other end coupled to the input of inverter 392. Inverter 390 provides the OUT signal, and inverter 392 provides the OUTb signal. Switch 380 and inverter 390 form one sample-and-hold circuit operating based on the CLK signal. Switch 382 and inverter 392 form another sample-and-hold circuit operating based on the CLK signal.

Synchronization circuit 354 utilizes two resampling stages. The first resampling stage comprises switches 360 and 362 and inverters 370 and 372 and operates based on the CLKb signal. The second resampling stage comprises switches 380 and 382 and inverters 390 and 392 and operates based on the CLK signal. Non-ideal waveforms of the signals at nodes B and C as well as different rise times of the CLK and CLKb signals may degrade performance and increase phase error. For a receiver, the increased phase error may result in phase and gain errors in downconverted baseband signals. The two-stage resampling shown in FIG. 7 may reduce phase error degradation and improve performance, e.g., provide better residual sideband (RSB) for downconversion.

FIGS. 3, 4, 6 and 7 show some exemplary designs of a synchronized frequency divider. A synchronized frequency divider may also be implemented with other designs, which may utilize single-ended frequency dividers and/or synchronization circuits different from those shown in FIGS. 3, 4, 6 and 7.

Referring back to FIG. 1, upconverter 136 may perform quadrature upconversion based on differential I TX LO signals and differential Q TX LO signals. Downconverter 156 may perform quadrature downconversion based on differential I RX LO signals and differential Q RX LO signals. A synchronization circuit described above in the exemplary designs may be employed to generate differential I and Q LO signals for quadrature upconversion or downconversion.

Figure 8:
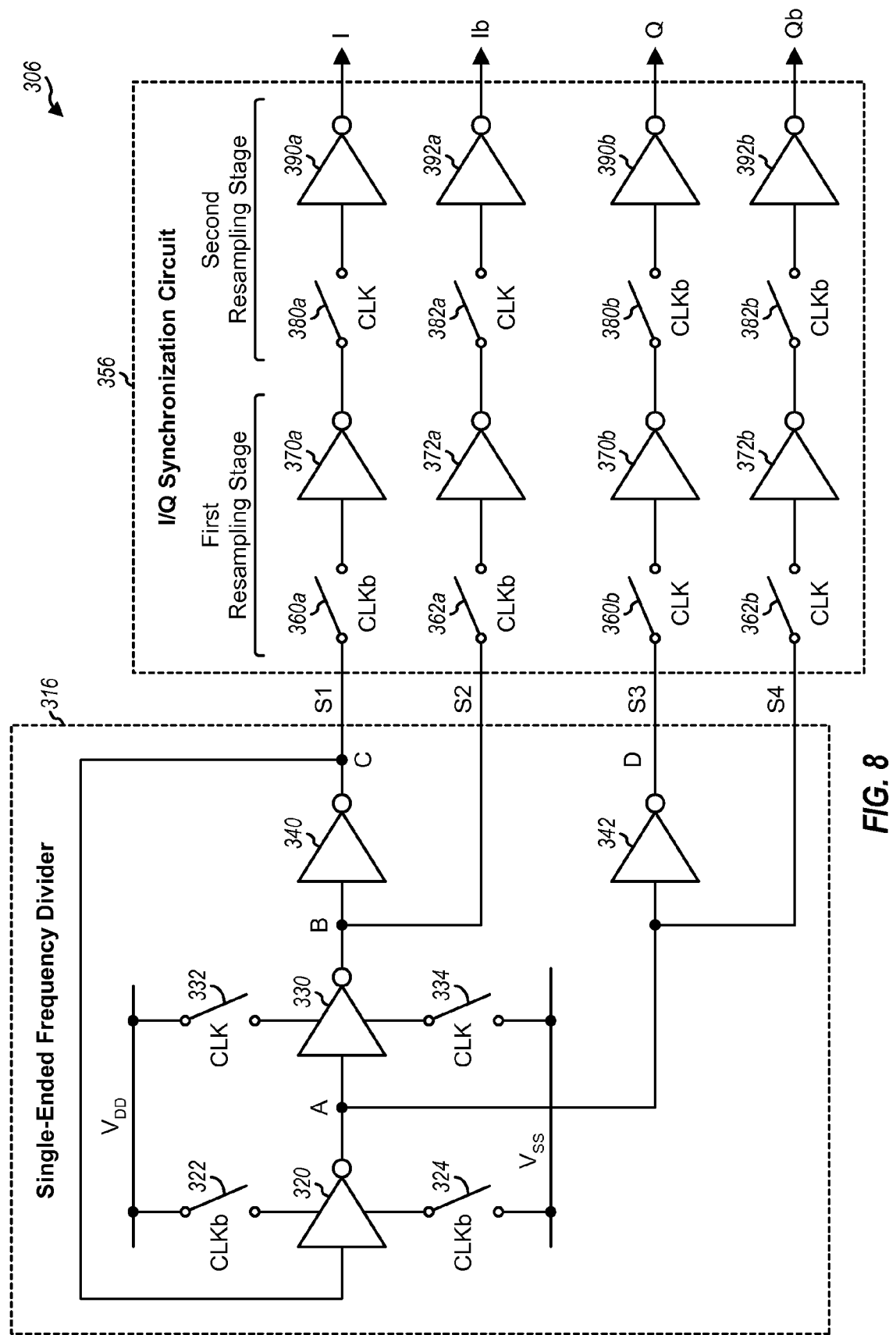
FIG. 8 shows another exemplary design of the synchronized frequency divider providing differential inphase (I) and quadrature (Q) local oscillator (LO) signals.

FIG. 8 shows a schematic diagram of an exemplary design of a synchronized frequency divider 306, which can provide differential I and Q LO signals. Synchronized frequency divider 306 includes a single-ended frequency divider 316 and an I/Q synchronization circuit 356.

Single-ended frequency divider 316 includes inverters 320, 330 and 340 and switches 322, 324, 332 and 334, which are coupled in a similar manner as described above for FIG. 3. Single-ended frequency divider 316 further includes an inverter 342 having its input coupled to node A and its output coupled to node D. Inverters 330 and 340 provide a first pair of complementary single-ended signals, S1 and S2. Inverters 320 and 342 provide a second pair of complementary single-ended signals, S3 and S4, which is offset from the first pair of complementary single-ended signals by one half clock cycle, as indicated in FIG. 5.

Synchronization circuit 356 includes a first set of switches 360a, 362a, 380a and 382a and inverters 370a, 372a, 390a and 392a for the differential I LO signals. Synchronization circuit 356 further includes a second set of switches 360b, 362b, 380b and 382b and inverters 370b, 372b, 390b and 392b for the differential Q LO signals. Each set of switches and inverters is coupled in a similar manner as described above for switches 360, 362, 380 and 382 and inverters 370, 372, 390 and 392 in FIG. 7. Switches 360a and 362a are coupled to nodes C and B, respectively. Switches 360b and 362b are coupled to nodes D and A, respectively. Inverter 390a provides a non-inverting I LO signal, I, inverter 392a provides an inverting I LO signal, Ib, inverter 390b provides a non-inverting Q LO signal, Q, and inverter 392b provides an inverting Q LO signal, Qb.

As shown in FIG. 8, switches 360a, 362a, 380b and 382b are controlled by the CLKb signal, and switches 360b, 362b, 380a and 382a are controlled by the CLK signal. The signal at node B is generated based on the CLK signal applied to switches 332 and 334 and is used to generate complementary single-ended signals, which are resampled by switches 360a and 362a based on the CLKb signal. Similarly, the signal at node A is generated based on the CLKb signal applied to switches 322 and 324 and is used to generate complementary single-ended signals, which are resampled by switches 360b and 362b based on the CLK signal. The signals at nodes A and B are offset by one half clock cycle. Hence, opposite clocks are used to resample the signals at nodes A and B.

In the exemplary design shown in FIG. 8, synchronization circuit 356 utilizes two resampling stages. The first resampling stage is composed of switches 360a, 362a, 360b and 362b and inverters 370a, 372a, 370b and 372b. The second resampling stage is composed of switches 380a, 382a, 380b and 382b and inverters 390a, 392a, 390b and 392b. The double resampling with the two stages shown in FIG. 8 may improve performance. In another exemplary design, a synchronization circuit may include a single resampling stage composed of switches 360a, 362a, 360b and 362b and inverters 370a, 372a, 370b and 372b.

In general, an apparatus may include a single-ended frequency divider and a synchronization circuit. The single-ended frequency divider may divide a clock signal in frequency and provide first and second single-ended signals (e.g., the S1 and S2 signals in FIG. 3). The synchronization circuit may resample the first and second single-ended signals based on the clock signal and provide differential output signals (e.g., the OUT and OUTb signals in FIG. 3).

In one exemplary design, the single-ended frequency divider may include first, second and third inverters (e.g., inverters 320, 330 and 340 in FIG. 3) coupled in a loop. The first inverter may be latched by a first version of the clock signal (e.g., the CLKb signal). The second inverter may be latched by a second version of the clock signal (e.g., the CLK signal). The first and second single-ended signals may be outputs from two of the inverters (e.g., from inverters 330 and 340 as shown in FIG. 3 or some other two inverters).

In one exemplary design, the synchronization circuit may include first and second switches (e.g., switches 360 and 362 in FIG. 3) and first and second inverters (e.g., inverters 370 and 372). The first and second switches may receive the first and second single-ended signals, respectively. The first and second inverters may be coupled to the first and second switches, respectively, and may provide the differential output signals, e.g., as shown in FIG. 3. In another exemplary design, the synchronization circuit may further include third and fourth switches (e.g., switches 380 and 382 in FIG. 7) and third and fourth inverters (e.g., inverters 390 and 392 in FIG. 7). The third and fourth switches may be coupled to the first and second inverters, respectively. The third and fourth inverters may be coupled to the third and fourth switches, respectively, and may provide the differential output signals, e.g., as shown in FIG. 7.

In yet another exemplary design, the synchronization circuit may include first and second inverters (e.g., inverters 370 and 372 in FIG. 6) and first and second switches (e.g., switches 364 and 374, or switches 366 and 376). The first and second inverters may receive the first and second single-ended signals, respectively. The first and second switches may enable and disable the first and second inverters, respectively.

The single-ended frequency divider may further provide third and fourth single-ended signals (e.g., the S3 and S4 signals in FIG. 8). The first and second single-ended signals may be complementary, and the third and fourth single-ended signals may also be complementary. In one exemplary design, the synchronization circuit may include a first resampling stage composed of first, second, third and fourth switches (e.g., switches 360a, 362a, 360b and 362b in FIG. 8) coupled to first, second, third and fourth inverters (e.g., inverters 370a, 372a, 370b and 372b). The first, second, third and fourth switches may receive the first, second, third, and fourth single-ended signals, respectively. The first and second inverters may provide differential I LO signals, and the third and fourth inverters may provide differential Q LO signals. In another exemplary design, the synchronization circuit may further include a second resampling stage composed of fifth, sixth, seventh and eighth switches (e.g., switches 380a, 382a, 380b and 382b) coupled to fifth, sixth, seventh and eighth inverters (e.g., inverters 390a, 392a, 390b and 392b). The fifth, sixth, seventh and eighth switches may be coupled to the first, second, third and fourth inverters, respectively. The fifth and sixth inverters may provide the differential I LO signals, and the seventh and eighth inverters may provide the differential Q LO signals. The switches may be controlled as shown in FIG. 8.

The apparatus may be an integrated circuit, a circuit board, a wireless communication device, etc. The single-ended frequency divider and the synchronization circuit may be implemented with MOS transistors (e.g., as shown in FIG. 4) and/or other types of transistors.

Figure 9:
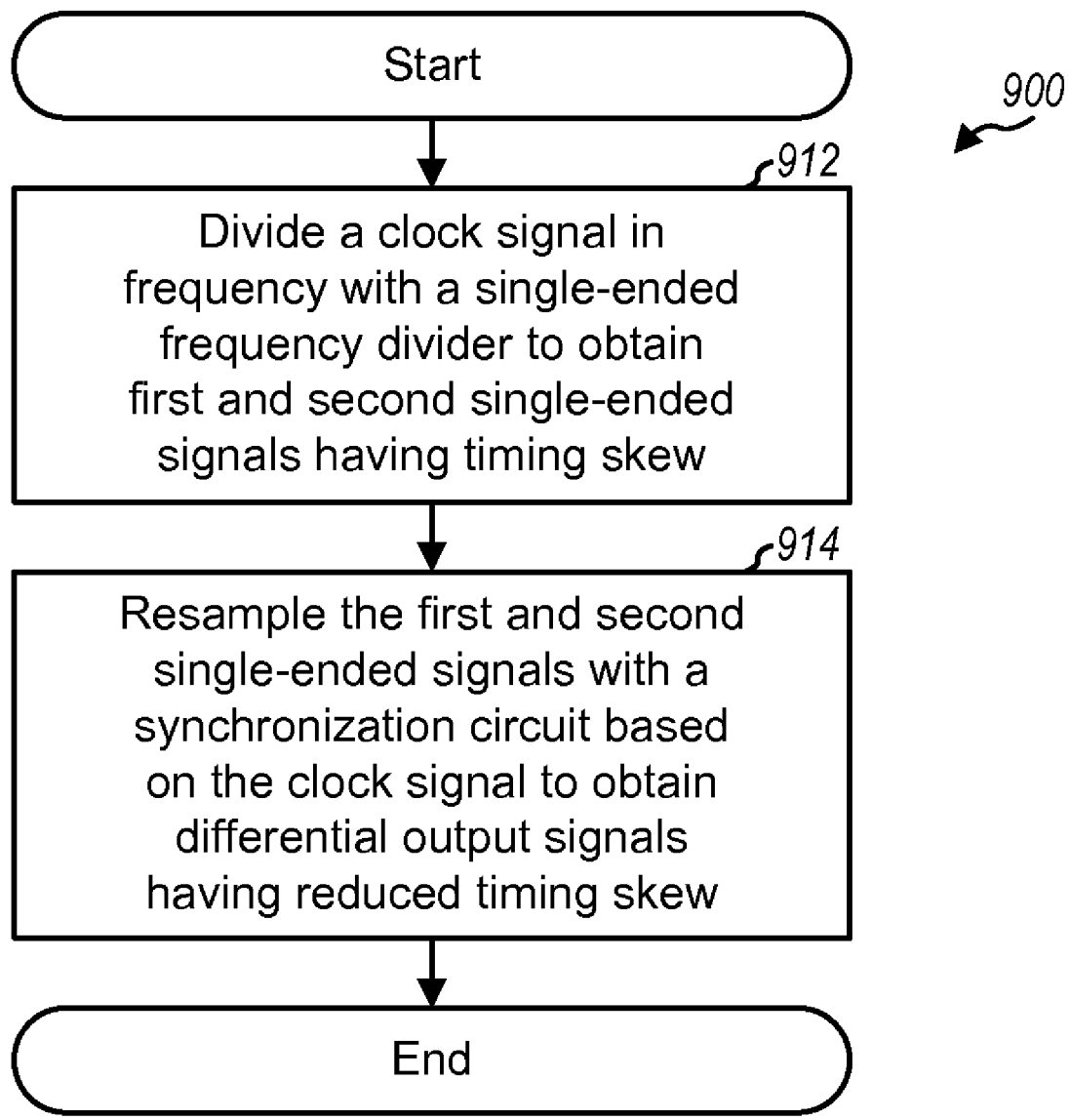
FIG. 9 shows a process for generating differential frequency divider output signals.

FIG. 9 shows an exemplary design of a process 900 for generating differential frequency divider output signals. A clock signal may be divided in frequency with a single-ended frequency divider to obtain first and second single-ended signals having timing skew (block 912). The first and second single-ended signals may be resampled with a synchronization circuit based on the clock signal to obtain differential output signals having reduced timing skew (block 914).

In one exemplary design of block 912, the first single-ended signal (e.g., the S1 signal in FIG. 3) may be latched with a first version of the clock signal (e.g., the CLKb signal) to obtain a third single-ended signal (e.g., the signal at node A in FIG. 3). The third single-ended signal may be latched with a second version of the clock signal (e.g., the CLK signal) to obtain the second single-ended signal (e.g., the S2 signal in FIG. 3). The second single-ended signal may be inverted to obtain the first single-ended signal.

In one exemplary design of block 914, the first single-ended signal may be resampled with a first sample-and-hold circuit (e.g., formed with switch 360 and inverter 370 in FIG. 3) or a first latch (e.g., formed with inverter 370 and switches 364 and 366 in FIG. 6) to obtain a first output signal. The second single-ended signal may be resampled with a second sample-and-hold circuit (e.g., formed with switch 362 and inverter 372 in FIG. 3) or a second latch (e.g., formed with inverter 372 and switches 374 and 376 in FIG. 6) to obtain a second output signal. The first and second output signals may form the differential output signals. In another exemplary design of block 914, the first and second single-ended signals may be resampled with a first resampling stage operating based on the first version of the clock signal. The outputs of the first resampling stage may then be resampled with a second resampling stage operating based on the second version of the clock signal to obtain the differential output signals, as shown in FIG. 7.

In another exemplary design, the clock signal may be divided in frequency to obtain first, second, third and fourth single-ended signals (e.g., the S1, S2, S3 and S4 signals in FIG. 8). The first, second, third and fourth single-ended signals may be resampled to obtain differential I LO signals and differential Q LO signals.

The synchronized frequency divider described herein may provide certain advantages. The synchronized frequency divider can generate differential output signals based on single-ended signals. The differential output signals are obtained by resampling with a clock signal and are thus time aligned. Furthermore, the differential output signals may have 50% duty cycle (even when the single-ended signals do not have 50% duty cycle) due to resampling with the clock signal. The time alignment and the 50% duty cycle of the differential output signals may be independent of IC process corners, output loading, supply voltage, and temperature. The synchronized frequency divider may remove timing skew caused by the delay of inverter 340. The synchronized frequency divider may also remove phase error caused by duty cycle or phase error in the clock signal since only one edge of the clock signal is used for resampling.

The synchronized frequency divider described herein may be implemented on an IC, an analog IC, an RFIC, a mixed-signal IC, an application specific integrated circuit (ASIC), a printed circuit board (PCB), an electronics device, a wireless device, etc. The synchronized frequency divider may also be fabricated with various IC process technologies such as CMOS, NMOS, PMOS, bipolar junction transistor (BJT), bipolar-CMOS (BiCMOS), silicon germanium (SiGe), gallium arsenide (GaAs), etc.

An apparatus implementing the synchronized frequency divider described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:
1. An apparatus comprising:
a single-ended frequency divider operative to:
  divide a clock signal in frequency; and
  provide first and second single-ended signals; and
a synchronization circuit coupled to the single-ended frequency divider and operative to:
  generate differential output signals comprising a first differential output signal and a second differential output signal;
  resample the first single-ended signal, but not the second single-ended signal, based on the clock signal to obtain the first differential output signal;

resample the second single-ended sinal based on the clock signal to obtain the second differential output signal; and output the differential output signals.

2. The apparatus of claim 1, wherein the single-ended frequency divider comprises a first inverter, a second inverter, and a third inverter coupled in a loop, the first inverter being latched solely by a first version of the clock signal, the second inverter being latched solely by a second version of the clock signal, the first and second single-ended signals being outputs from two inverters of the first inverter, the second inverter, and the third inverter.

3. The apparatus of claim 1, wherein the synchronization circuit comprises:
first and second switches coupled to the single-ended frequency divider and operative to receive the first and second single-ended signals, respectively; and
first and second inverters coupled to the first and second switches, respectively, and operative to provide the differential output signals.

4. The apparatus of claim 1, wherein the synchronization circuit comprises:
first and second inverters coupled to the single-ended frequency divider and operative to receive the first and second single-ended signals, respectively; and
first and second switches coupled to outputs of the first and second inverters, respectively, and operative to enable and disable the first and second inverters, respectively.

5. The apparatus of claim 1, wherein the synchronization circuit comprises:
first and second switches coupled to the single-ended frequency divider and operative to receive the first and second single-ended signals, respectively;
first and second inverters coupled to the first and second switches, respectively;
third and fourth switches coupled to the first and second inverters, respectively;
third and fourth inverters coupled to the third and fourth switches, respectively; and operative to provide the differential output signals.

6. The apparatus of claim 5, wherein the first and second switches are controlled based on a first version of the clock signal, and wherein the third and fourth switches are controlled based on a second version of the clock signal.

7. The apparatus of claim 1, wherein the single-ended frequency divider is further operative to provide third and fourth single-ended signals, and wherein the synchronization circuit comprises:
first, second, third, and fourth switches coupled to the single-ended frequency divider and operative to receive the first, second, third, and fourth single-ended signals, respectively; and
first, second, third, and fourth inverters coupled to the first, second, third, and fourth switches, respectively, the first and second inverters providing differential inphase (I) local oscillator (LO) signals, and the third and fourth inverters providing differential quadrature (Q) LO signals.

8. The apparatus of claim 7, wherein the synchronization circuit further comprises:
fifth, sixth, seventh, and eighth switches coupled to the first, second, third, and fourth inverters, respective; and
fifth, sixth, seventh, and eighth inverters coupled to the fifth, sixth, seventh, and eighth switches, respectively, the fifth and sixth inverters providing the differential I LO signals, and the seventh and eighth inverters providing the differential Q LO signals.

9. The apparatus of claim 8, wherein the first, second, seventh, and eighth switches are controlled based on a first version of the clock signal, and wherein the third, fourth, fifth, and sixth switches are controlled based on a second version of the clock signal.

10. A wireless device comprising:
a frequency converter operative to:
frequency convert an input signal with differential local oscillator (LO) signals; and
provide a frequency converted signal;
an LO signal generator coupled to the frequency converter and comprising:
a single-ended frequency divider operative to:
divide a clock signal in frequency; and
provide first and second single-ended signals; and
a synchronization circuit coupled to the single-ended frequency divider and operative to:
generate the differential (LO) signals comprising a first differential (LO) signal and a second differential LO signal;
resample the first single-ended signal, but not the second single-ended signal, based on the clock signal to obtain the first differential LO signal;
resample the second single-ended signal based on the clock signal to obtain the second differential LO signal; and
generate the differential LO signals; and
an antenna operatively coupled to the frequency converter.

11. The wireless device of claim 10, wherein the single-ended frequency divider is operative to further provide third and fourth single-ended signals, and wherein the synchronization circuit is operative to:
resample the first, second, third, and fourth single-ended signals based on the clock signal; and
provide differential inphase (I) LO signals and differential quadrature (Q) LO signals.

12. The wireless device of claim 11, wherein the frequency converter comprises a downconverter operative to frequency downconvert an input radio frequency (RF) signal with the differential I LO signals and the differential Q LO signals and provide I and Q downconverted signals.

13. The wireless device of claim 11, wherein the frequency converter comprises an upconverter operative to frequency upconvert input I and Q baseband signals with the differential I LO signals and the differential Q LO signals and provide an upconverted signal.

14. A method comprising:
dividing a clock signal in frequency to obtain first and second single-ended signals having timing skew;
generating differential output signals having reduced timing skew, wherein the differential output signals comprise a first differential output signal and a second differential output signal,
resampling the first single-ended signal, but not the second single-ended signal, based on the clock signal to obtain the first differential output signal; and
resampling the second single-ended signal based on the clock signal to obtain the second differential output signal.

15. The method of claim 14, wherein the dividing the clock signal comprises:
latching the first single-ended signal with a first version of the clock signal to obtain a third single-ended signal;
latching the third single-ended signal with a second version of the clock signal to obtain the second single-ended signal; and inverting the second single-ended signal to obtain the first single-ended.

16. The method of claim 14, wherein the resampling the first and second single-ended signals comprises:
resampling the first single-ended signal with a first sample-and-hold circuit or a first latch to obtain the first differential output signal; and
resampling the second single-ended signal with a second sample-and-hold circuit or a second latch to obtain the second differential output signal.

17. The method of claim 14, wherein the resampling of the first single-ended signal comprises:
resampling the first single-ended signal with a first resampling stage operating based on a first version of the clock signal; and
resampling an output of the first resampling stage with a second resampling stage operating based on a second version of the clock signal to obtain the first differential output signal.

18. The method of claim 14, wherein the dividing of the clock signal comprises dividing the clock signal in frequency to obtain first, second, third, and fourth, single-ended signals, and wherein the resampling the first and second single-ended signals comprises resampling the first, second, third, and fourth single-ended signals to obtain differential inphase (I) local oscillator (LO) signals and differential quadrature (Q) LO signals.

19. An apparatus comprising:
means for dividing a clock signal in frequency to obtain first and second single-ended signals having timing skew; and
means for generating differential output signals having reduced timing skew, wherein the differential output signals comprise a first differential output signal and a second differential output signal, and wherein the means for generating includes:
first means for resampling the first single-ended signal, but not the second single ended signal, based on the clock signal to obtain the first differential output signal; and
second means for resampling the second single-ended signal based on the clock signal to obtain the second differential output signal.

20. The apparatus of claim 19, wherein the means for dividing the clock signal comprises:
means for latching the first single-ended signal with a first version of the clock signal and no other signal, to obtain a third single-ended signal;
means for latching the third single-ended signal with a second version of the clock signal and no other signal, to obtain the second single-ended signal; and
means for inverting the second single-ended signal to obtain the first single-ended signal.

21. The apparatus of claim 19, wherein the means for resampling the first single-ended signal comprises means for resampling the first single-ended signal with a first sample-and-hold circuit or a first latch to obtain the first differential signal, and wherein the means for resampling the second single-ended signal comprises means for resampling the second single-ended signal with a second sample-and-hold circuit or a second latch to obtain the second differential signal.

22. The apparatus of claim 19, wherein the means for resampling the first single-ended signal comprises:
means for resampling the first single-ended signal with a first resampling stage operating based on a first version of the clock signal; and
means for resampling an output of the first resampling stage with a second resampling stage operating based on a second version of the clock signal to obtain the first differential signal.

23. The apparatus of claim 19, wherein the means for dividing the clock signal comprises means for dividing the clock signal in frequency to obtain first, second, third, and fourth single-ended signals, and wherein the means for resampling the first and second single-ended signals comprises means for resampling the first, second, third, and fourth single-ended signals to obtain differential inphase (I) local oscillator (LO) signals and differential quadrature (Q) LO signals.

24. The apparatus of claim 1, wherein the synchronization circuit comprises an I/Q synchronization circuit that synchronizes signals on an I channel and a Q channel.

25. The wireless device of claim 10, wherein the synchronization circuit comprises an I/Q synchronization circuit that synchronizes signals on an I channel and a Q channel.

26. The method of claim 14, wherein resampling the first single-ended signal comprises resampling the first single-ended signal on an I channel and wherein resampling the second single-ended signal comprises resampling the second single-ended signal on a Q channel.

27. The apparatus of claim 19, wherein the first means for resampling resamples the first single-ended signal on an I channel and wherein the second means for resampling resamples the second single-ended signal on a Q channel.

* * * * *